United States Patent
Hayakawa et al.

(10) Patent No.: US 8,563,362 B2
(45) Date of Patent: Oct. 22, 2013

(54) METHOD OF PRODUCING SEMICONDUCTOR CHIP LAMINATE COMPRISING AN ADHESIVE THAT COMPRISES A CURING COMPOUND, CURING AGENT AND SPACER PARTICLES

(75) Inventors: Akinobu Hayakawa, Osaka (JP); Hideaki Ishizawa, Osaka (JP); Kohei Takeda, Osaka (JP); Ryohei Masui, Osaka (JP)

(73) Assignee: Sekisui Chemical Co., Ltd., Osaka (JP)

( * ) Notice: Subject to any disclaimer, the term of this patent is extended or adjusted under 35 U.S.C. 154(b) by 27 days.

(21) Appl. No.: 13/255,799

(22) PCT Filed: Mar. 10, 2010

(86) PCT No.: PCT/JP2010/054026
§ 371 (c)(1),
(2), (4) Date: Oct. 3, 2011

(87) PCT Pub. No.: WO2010/104125
PCT Pub. Date: Sep. 16, 2010

(65) Prior Publication Data
US 2012/0021233 A1    Jan. 26, 2012

(30) Foreign Application Priority Data
Mar. 10, 2009  (JP) ................................. 2009-056400

(51) Int. Cl.
*H01L 21/44*  (2006.01)
(52) U.S. Cl.
USPC ........... 438/118; 438/107; 257/777; 257/789; 257/795; 257/E21.499
(58) Field of Classification Search
USPC ................ 438/107, 118; 257/777, 789, 795, 257/E21.499, E21.503
See application file for complete search history.

(56) References Cited

U.S. PATENT DOCUMENTS

| 7,851,930 | B1 * | 12/2010 | Gupta ........................... 257/787 |
| 2003/0080437 | A1 * | 5/2003 | Gonzalez et al. ............. 257/778 |
| 2004/0181025 | A1 * | 9/2004 | Schindler et al. .............. 528/38 |
| 2005/0282924 | A1 * | 12/2005 | Katogi et al. ................. 522/170 |
| 2009/0311827 | A1 | 12/2009 | Ishizawa et al. |

FOREIGN PATENT DOCUMENTS

| CN | 1970671 A | 5/2007 |
| CN | 1971888 A | 5/2007 |
| JP | 57037839 A | 3/1982 |
| JP | 2003-179200 A | 6/2003 |
| JP | 2003-188192 A | 7/2003 |
| JP | 2006-032625 A | 2/2006 |
| JP | 2006-066816 A | 3/2006 |
| WO | WO-2008/010555 A1 | 1/2008 |

* cited by examiner

Primary Examiner — Thanh V Pham
(74) Attorney, Agent, or Firm — Novak Druce Connolly Bove + Quigg LLP

(57) ABSTRACT

A method for producing a semiconductor chip laminate, which comprises applying an adhesive to a substrate or other semiconductor chip; laminating the semiconductor chip on the substrate or other semiconductor chip via the adhesive; uniformly wetting and spreading the adhesive on an entire region for bonding the semiconductor chip on the substrate or other semiconductor chip; and curing the adhesive. In the application step, an area for applying adhesive is 40% to 90% of the region for bonding the semiconductor chip located on the substrate or other semiconductor chip, immediately after laminating, an area with the adhesive thereon is 60% to less than 100% of the region for bonding the semiconductor chip on the substrate or other semiconductor chip, and in wetting and spreading the adhesive, a viscosity of adhesive between the substrate or other semiconductor chips and the semiconductor chip at 0.5 rpm is 1 Pas to 30 Pas.

16 Claims, 5 Drawing Sheets

METHOD OF PRODUCING SEMICONDUCTOR CHIP LAMINATE COMPRISING AN ADHESIVE THAT COMPRISES A CURING COMPOUND, CURING AGENT AND SPACER PARTICLES

CROSS REFERENCE TO RELATED APPLICATIONS

This application is a National Phase filing under 35 U.S.C. §371 of PCT/JP2010/054026, filed on Mar. 10, 2010; and this application claims priority to Application No. 2009-056400, filed in Japan on Mar. 10, 2009 under 35 U.S.C. §119; the entire contents of all are hereby incorporated by reference.

TECHNICAL FIELD

The present invention relates to a method for producing a semiconductor chip laminate, which adjusts the amount of an adhesive for semiconductor components extending from a bonded region of a semiconductor chip and provides a smaller but highly-precise and highly-reliable semiconductor chip laminate. The present invention also relates to a semiconductor device, which is produced by the

BACKGROUND ART

With a demand for miniaturizing semiconductor packages, semiconductor chips have been used as very thin films, and bonding wires connected to semiconductor chips have been miniaturized. In addition, since very thin semiconductor chips can be formed, there has been a trend of a three-dimensional packaging technology in which a plurality of semiconductor chips is laminated to provide a multilayer semiconductor chip laminate.

In multilayer semiconductor chip laminates, the mere lamination of semiconductor chips having the same size causes a bonding wire connected to the underlying semiconductor chip to contact the overlying semiconductor chip, likely leading to failure to wire bond these. Then, a method of laminating semiconductor chips having different sizes and a method of forming a clearance between semiconductor chips have been devised. However, it has been not easy to horizontally laminate semiconductor chips without damaging each of the semiconductor chips.

In contrast, there have been conventionally examined a method of protecting wires of a lower semiconductor chip in order to obtain a reliable semiconductor chip laminate, a method of interposing a spacer chip between semiconductor chips so that the semiconductor chips are horizontally laminated, and the like. Patent Document 1, for example, discloses a method of forming spacers in a scattered manner on a face of one semiconductor chip on which the other semiconductor chip is to be laminated, upon laminating a plurality of semiconductor chips, and thereafter laminating the other semiconductor chip. Patent Document 2 discloses a method of laminating dummy chips and spacers between semiconductor chips to be connected, upon laminating a plurality of semiconductor chips.

However, semiconductor packages have recently been more and more miniaturized, and the distance between a semiconductor chip and a wire bonding pad have become shorter and shorter. As a result, novel problems that the methods of Patent Document 1 or Patent Document 2 cannot address have arisen.

That is, conventional adhesives for bonding a semiconductor chip to a substrate or another semiconductor chip extend from the semiconductor chip and reach a wire bonding pad. As the distance between a semiconductor chip and a wire bonding pad becomes shorter, an extended adhesive, that is, what is called a fillet, makes wire bonding difficult. In the case where the amount of the adhesive used is reduced in order to prevent the extension of the adhesive, the adhesive does not wet and spread on the entire bonded surface between the semiconductor chip and the substrate or another semiconductor chip, and causes a cavity after mold sealing, resulting in difficulty in achieving sufficient reliability of the produced semiconductor chip laminate.

PRIOR ART DOCUMENTS

Patent Documents
  Patent Document 1: Japanese Kokai Publication 2003-179200 (JP-A 2003-179200)
  Patent Document 2: Japanese Kokai Publication 2006-66816 (JP-A 2006-66816)

SUMMARY OF THE INVENTION

Problems to be Solved by the Invention

It is an object of the present invention to provide a method for producing a semiconductor chip laminate, which adjusts the amount of an adhesive for semiconductor components extending from a bonded region of a semiconductor chip and provides a smaller but highly-precise and highly-reliable semiconductor chip laminate. It is another object of the present invention to provide a semiconductor device, which is produced by the method for producing the semiconductor chip laminate according to the present invention.

Means for Solving the Problems

The present invention relates to a method for producing a semiconductor chip laminate, the semiconductor chip being bonded to a substrate or an other semiconductor chip via an adhesive for semiconductor components,
  the method comprising the steps of:
  (1) applying the adhesive for semiconductor components to the substrate or the other semiconductor chip;
  (2) laminating the semiconductor chip on the substrate or the other semiconductor chip via the applied adhesive for semiconductor components;
  (3) uniformly wetting and spreading the adhesive for semiconductor components on an entire region for bonding the semiconductor chip located on the substrate or the other semiconductor chip; and
  (4) curing the adhesive for semiconductor components,
  wherein, in the application step (1), an area for applying the adhesive for semiconductor components is 40% to 90% of the region for bonding the semiconductor chip located on the substrate or the other semiconductor chip,
  immediately after the semiconductor chip laminating step (2), an area with the adhesive for semiconductor components wetting and spreading thereon is 60% or more and less than 100% of the region for bonding the semiconductor chip located on the substrate or the other semiconductor chip, and
  in the step (3) of uniformly wetting and spreading the adhesive for semiconductor components, when measured by an E-type viscometer, a viscosity of the adhesive for semiconductor components between the substrate or the other semiconductor chip and the semiconductor chip at 0.5 rpm is 1 Pa·s to 30 Pa·s.

Hereinafter, the present invention will be described in detail.

The present inventors found the following. In a method for producing a semiconductor chip laminate, the semiconductor chip is bonded to a substrate or another semiconductor chip via an adhesive for semiconductor components. The method comprises the steps of a predetermined application step (1), a predetermined semiconductor chip laminating step (2), a predetermined step (3) of uniformly wetting and spreading the adhesive for semiconductor components, and a predetermined curing step (4). In the case where the area for applying the adhesive for semiconductor components in the application step (1) is set to a predetermined size range, and the area with the adhesive for semiconductor components wetting and spreading thereon is set to a predetermined size range immediately after a semiconductor chip laminating step (2), and further the step (3) of uniformly wetting and spreading the adhesive for semiconductor components is performed under predetermined conditions, the amount of the adhesive for semiconductor components extending from the bonded region of the semiconductor chip is adjusted, and thereby good wire bonding is enabled also in miniaturized semiconductor chip laminates, leading to production of a highly-precise and highly-reliable semiconductor chip laminate. The present inventors thus completed the present invention.

The method for producing a semiconductor chip laminate of the present invention is a method for producing a semiconductor chip laminate in which a semiconductor chip is bonded to a substrate or another semiconductor chip via an adhesive for semiconductor components.

In the method for producing a semiconductor chip laminate of the present invention, a semiconductor chip may be bonded to the substrate to produce a semiconductor chip laminate, or for example, a semiconductor chip may be bonded to another semiconductor chip such as a semiconductor chip bonded to the substrate to produce a multilayer semiconductor chip laminate.

In the method for producing a semiconductor chip laminate of the present invention, the step (1) of applying the adhesive for semiconductor components to a substrate or another semiconductor chip is first performed.

The application method in the application step (1) is not particularly limited, and examples thereof include an application method with combined use of a syringe provided with a precision nozzle, etc. and a dispenser, etc.

In the application step (1), the area for applying the adhesive for semiconductor components is 40% to 90% of the region for bonding the semiconductor chip located on the substrate or another semiconductor chip in the below-described semiconductor chip laminating step (2) (hereinafter, also referred to as a bonded region.) The area for applying the adhesive for semiconductor components used herein means areas in one or more polygons formed by straight lines and the total of the areas, the straight lines tracing the outermost part of the applied adhesive for semiconductor components.

If the area for applying the adhesive for semiconductor components is less than 40% of the bonded region, after the below-mentioned step (3) of uniformly wetting and spreading the adhesive for semiconductor components, the adhesive for semiconductor components does not uniformly wet and spread on the entire bonded region, and causes a cavity after mold sealing, resulting in lack of reliability of the produced semiconductor chip laminate. If the area for applying the adhesive for semiconductor components exceeds 90% of the bonded region, after the below-mentioned step (3) of uniformly wetting and spreading the adhesive for semiconductor components, the amount of the adhesive for semiconductor components extending from the bonded region increases, resulting in difficulty in wire bonding to the produced semiconductor chip laminate. The area for applying the adhesive for semiconductor components is preferably 60% to 90% of the bonded region.

The adhesive for semiconductor components preferably contains an adhesive composition comprising a curing compound and a curing agent.

The curing compound is not particularly limited, and examples thereof include compounds cured by addition polymerization, polycondensation, polyaddition, addition condensation, and ring-opening polymerization reaction. Specific examples of the curing compound include thermosetting resins such as a urea resin, a melamine resin, a phenolic resin, a resorcinol resin, an epoxy resin, an acrylic resin, a polyester resin, a polyamide resin, a polybenzimidazole resin, a diallyl phthalate resin, a xylene resin, an alkylbenzene resin, an epoxy acrylate resin, a silicone resin, and a urethane resin. Among others, due to excellent reliability and bonding strength of the produced semiconductor chip laminate, the epoxy resin and the acrylic resin are preferable, and an epoxy resin having an imide skeleton is more preferable.

The epoxy resin is not particularly limited, and examples thereof include: bisphenol type epoxy resins such as bisphenol A type, bisphenol F type, bisphenol AD type, and bisphenol S type; novolak type epoxy resins such as phenol novolak type and cresol novolak type; a resorcinol type epoxy resin; aromatic epoxy resins such as trisphenolmethane triglycidyl ether; a naphthalene type epoxy resin; a fluorene type epoxy resin; a dicyclopentadiene type epoxy resin; a polyether-modified epoxy resin; an NBR-modified epoxy resin, a CTBN modified epoxy resin; and their hydrogenated products. Among others, the bisphenol F type epoxy resin, the resorcinol type epoxy resin, and the polyether-modified epoxy resin are preferable because an adhesive for semiconductor components having a lower viscosity can be produced.

Examples of commercial products of the bisphenol F type epoxy resin include EXA-830-LVP and EXA-830-CRP (all produced by DIC Corporation). Examples of commercial products of the resorcinol type epoxy resin include EX-201 (produced by Nagase ChemteX Corporation). Examples of commercial products of the polyether-modified epoxy resin include EX-931 (produced by Nagase ChemteX Corporation), EXA-4850-150 (produced by DIC Corporation), and EP-4005 (produced by ADEKA Corporation).

The preferable upper limit of moisture absorption of the curing compound is 1.5%, and the more preferable upper limit thereof is 1.1%. Examples of the curing compound having such moisture absorption include a naphthalene type epoxy resin, a fluorene type epoxy resin, a dicyclopentadiene type epoxy resin, a phenol novolak type epoxy resin, and a cresol novolak type epoxy resin.

The curing agent is not particularly limited, and a conventionally known curing agent can be appropriately selected according to the curing compound. Examples of the curing agent upon use of an epoxy compound as the curing compound include: heat curing acid anhydride type curing agents such as trialkyltetrahydrophthalic anhydride; phenol type curing agents; amine type curing agents; latent curing agents such as dicyandiamide; and cationic catalytic type curing agents. Each of these curing agents may be used alone, or two or more of these may be used in combination.

The amount of the curing agent is not particularly limited, and preferably 60 to 100 in an equivalent amount with respect to the amount of functional groups of the curing compound upon use of the curing agent that reacts with the functional groups of the curing compound in an equivalent amount.

Moreover, in the case where a curing agent that functions as a catalyst is used, the preferable lower limit of the amount of the curing agent is 1 part by weight and the preferable upper limit thereof is 20 parts by weight, for 100 parts by weight of the curing compound.

A curing accelerator may be added to the adhesive composition in addition to the curing agent so as to control a curing rate, physical properties of a cured material, and the like.

The curing accelerator is not particularly limited. Examples thereof include an imidazole-type curing accelerator and a tertiary amine-type curing accelerator. Suitably used among these is the imidazole-type curing accelerator because such an accelerator makes it easy to control a reaction system for controlling a curing rate, physical properties of a cured material, and the like. Each of these curing accelerators may be used alone, or two or more of these may be used in combination.

The imidazole-type curing accelerator is not particularly limited. Examples thereof include: 1-cyanoethyl-2-phenylimidazole with the 1-position of imidazole protected by a cyanoethyl group; and an imidazole-type curing accelerator with its basicity protected by isocyanuric acid (trade name "2MA-OK", produced by SHIKOKU CHEMICALS Corp.). Each of these imidazole-type curing accelerators may be used alone, or two or more of these may be used in combination.

The amount of the curing accelerator is not particularly limited. The preferable lower limit thereof is 1 part by weight, and the preferable upper limit thereof is 10 parts by weight, for 100 parts by weight of the curing compounds.

Examples of the curing accelerator include 2MZ, 2MZ-P, 2PZ, 2PZ-PW, 2P4MZ, C11Z-CNS, 2PZ-CNS, 2PZCNS-PW, 2MZ-A, 2MZA-PW, C11Z-A, 2E4MZ-A, 2MA-OK, 2MAOK-PW, 2PZ-OK, 2MZ-OK, 2PHZ, 2PHZ-PW, 2P4 MHZ, 2P4 MHZ-PW, 2E4MZ-BIS, VT, VT-OK, MAVT, and MAVT-OK (each produced by SHIKOKU CHEMICALS Corp.).

In the case of using an epoxy resin as the curing compound and using both the curing agent and the curing accelerator, the amount of the curing agent is preferably equal to or less than the theoretically required equivalent to the epoxy groups in the epoxy resin to be used. In the case where the amount of the curing agent exceeds the theoretically required equivalent, chloride ions may be eluted with water from a cured material obtained by curing the adhesive for semiconductor components. That is, in the case of excessively adding the curing agent, for example, extracted water has a pH of about 4 to 5 upon extracting the eluted constituents with hot water from a cured material of the produced adhesive for semiconductor components, so that a large amount of the chloride ion may be eluted from the epoxy resin. Accordingly, after immersing 1 g of a cured material of the adhesive for electronic components to be produced in 10 g of pure water at 100° C. for 2 hours, a pH of the pure water is preferably 6 to 8 and more preferably 6.5 to 7.5.

The adhesive composition may contain a diluent in order to reduce the viscosity.

The diluent preferably has an epoxy group. The preferable lower limit of the number of epoxy groups in one molecule is 2, and the preferable upper limit thereof is 4. If the number of epoxy groups in one molecule is less than 2, sufficient heat resistance after curing the adhesive for semiconductor components may not be expressed. If the number of epoxy groups in one molecule exceeds 4, distortion caused by curing may occur, and uncured epoxy groups may remain. As a result, reduction in bonding strength or poor bonding caused by repeated thermal stress may occur. The preferable upper limit of the number of epoxy groups in one molecule of the diluent is 3.

The diluent preferably has an aromatic ring and/or dicyclopentadiene structure.

The preferable upper limit of a weight loss rate of the diluent at 120° C. and 150° C. is 1%. In the case where the weight loss rate of the diluent at 120° C. and 150° C. is more than 1%, unreacted substances in the adhesive may volatilize during and after curing of the adhesive for semiconductor components, likely resulting in bad influence on productivity or on performance of a semiconductor chip laminate to be produced.

Preferably, the diluent has a lower curing starting temperature and is cured at a higher rate compared to other curing compounds.

The preferable lower limit of the amount of the diluent in the adhesive composition is 1% by weight, and the preferable upper limit thereof is 20% by weight. If the amount of the diluent is outside the above range, the viscosity of the adhesive composition may not be sufficiently reduced.

The adhesive for semiconductor components preferably contains spacer particles having a CV value of 10% or less.

The adhesive containing such spacer particles having a CV value of 10% or less makes it possible to maintain a distance constant between chips without a dummy chip interposed therebetween upon, for example, producing a multilayer semiconductor chip laminate by the method for producing a semiconductor chip laminate of the present invention.

In the case where the CV value of the spacer particles is more than 10%, wide variations occur in particle sizes, and thus, it is difficult to maintain a distance constant between chips, and the spacer particles may not sufficiently exert their function. The more preferable upper limit of the CV value of the spacer particles is 6%, and the further preferable upper limit thereof is 4%.

The "CV value" used herein is a value obtained by the following formula (1):

$$\text{CV value of particle size (\%)} = (\sigma 2/Dn2) \times 100 \tag{1}$$

In the formula (1), σ2 represents a standard deviation of particle sizes and Dn2 represents a number average particle size.

The "distance between chips" used herein means both the distance between a substrate and a semiconductor chip and the distance between semiconductor chips.

The average particle size of the spacer particles having a CV value of 10% or less (hereinafter, simply referred to as spacer particles) is not particularly limited as long as the semiconductor components are allowed to have a desired distance between chips. The preferable lower limit thereof is 5 μm, and the preferable upper limit thereof is 200 μm. In the case where the average particle size of the spacer particles is less than 5 μm, it may be difficult to narrow a distance between chips to the similar size of the particle sizes of the spacer particles upon, for example, producing a multilayer semiconductor chip laminate by the method for producing a semiconductor chip laminate of the present invention. In the case where the average particle size of the spacer particles is more than 200 μm, chips may have a distance wider than required upon, for example, producing a multilayer semiconductor chip laminate by the method for producing a semiconductor chip laminate of the present invention. The more preferable lower limit of the average particle size of the spacer particles is 9 μm, and the more preferable upper limit thereof is 50 μm.

The average particle size of the spacer particles is preferably 1.2 or more times of the average particle size of solid portions added to the adhesive for semiconductor components in addition to the spacer particles. In the case where the average particle size of the spacer particles is less than 1.2 times of the average particle size of the solid portions in addition to the spacer particles, it may be difficult to reliably narrow a distance between chips to the similar size of the particle sizes of the spacer particles upon, for example, producing a multilayer semiconductor chip laminate by the method for producing a semiconductor chip laminate of the present invention. The average particle size of the spacer particles is more preferably 1.3 or more times of the average particle size of the solid portions in addition to the spacer particles.

A standard deviation of the particle size distribution of the spacer particles is preferably 10% or less of the average particle size of the spacer particles. As a result, semiconductor chips can be horizontally laminated with greater stability upon, for example, producing a multilayer semiconductor chip laminate by the method for producing a semiconductor chip laminate of the present invention.

With respect to a K value of the spacer particles represented by the following formula (2), the preferable lower limit thereof is 980 N/mm² and the preferable upper limit thereof is 4900 N/mm².

$$K=(3/\sqrt{2}) \cdot F \cdot S^{-3/2} \cdot R^{-1/2} \qquad (2)$$

In the formula (2), F represents a load value (kgf) in 10% compressive deformation of spacer particles, S represents a compression displacement (mm) in 10% compressive deformation of spacer particles, and R represents a radius (mm) of the spacer particle.

The K value can be measured by the following method.

First, spacer particles are dispersed on a steel plate having a flat surface, and then one spacer particle selected from among the spacer particles is compressed by a flat end face of a diamond round pillar with a diameter of 50 μm using a micro compression testing apparatus. Upon the compression, a compression load is electrically detected as an electromagnetic force and a compression displacement is electrically detected as a displacement by a differential transformer. Then, a load value and a compression displacement in 10% compressive deformation are determined by the obtained compression displacement-load relationship, and the K value is calculated from the obtained result.

With respect to a compression recovery rate upon releasing the spacer particles from the 10% compressive deformation state at 20° C., the preferable lower limit thereof is 20%. In the case of using the spacer particles having such a compression recovery rate and thereby, for example, producing a multilayer semiconductor chip laminate by the method for producing a semiconductor chip laminate of the present invention, even a spacer particle having a particle size larger than the average particle size present between the laminated semiconductor chips can serve as a gap adjuster through recovery of its shape by compressive deformation. Thus, the semiconductor chips can be horizontally laminated with greater stability with a predetermined distance therebetween.

The compression recovery rate can be measured by the following method.

As in the same method for measuring the K value, a compression displacement is electrically detected as a displacement by a differential transformer. The spacer particle is compressed to a reverse load value, and then gradually released from the load. The relationship between the load and the compression displacement at that time is measured. The compression recovery rate is calculated from the obtained measurement result. The terminal load value of the compression release is not zero but an original load value of 0.1 g or more.

A material of the spacer particles is not particularly limited, but the spacer particles are preferably resin particles.

A resin for the resin particles is not particularly limited. Examples thereof include polyethylene, polypropylene, polymethyl pentene, polyvinyl chloride, polytetrafluoro ethylene, polystyrene, polymethyl methacrylate, polyethylene terephthalate, polybutylene terephthalate, polyamide, polyimide, polysulfone, polyphenylene oxide, and polyacetal. Crosslinked resins are preferably used because, by using such resins, it is easy to adjust the hardness and compression recovery rate of the spacer particles and it is possible to improve the heat resistance of the spacer particles.

The crosslinked resins are not particularly limited. Examples thereof include resins having a mesh structure, such as an epoxy resin, a phenol resin, a melamine resin, an unsaturated polyester resin, a divinylbenzene polymer, a divinylbenzene-styrene copolymer, a divinylbenzene-(meth)acrylate copolymer, a diallyl phthalate polymer, a triallyl isocyanurate polymer, and a benzoguanamine polymer. The divinylbenzene polymer, the divinylbenzene-styrene copolymer, the divinylbenzene-(meth)acrylate copolymer, the diallyl phthalate polymer and the like are preferably used among these. The adhesive containing these crosslinked resins has excellent resistance to heat treatments such as a curing process and a solder reflowing process after bonding semiconductor chips.

Preferably, the surface of the spacer particles is optionally treated.

The produced adhesive for semiconductor components can achieve the below-mentioned viscosity characteristics by containing the surface-treated spacer particles.

The surface treating method is not particularly limited. For example, it is preferable to impart a hydrophilic group to the surface in the case where the entire adhesive composition has hydrophobicity. A method for imparting the hydrophilic group to the surface is not particularly limited. An example thereof is, in the case of using the resin particles as the spacer particles, a method in which the surface of the resin particles is treated with a hydrophilic group-containing coupling agent.

The spacer particles preferably have a spherical shape. The preferable upper limit of an aspect ratio of the spacer particles is 1.1. In the case where the aspect ratio thereof is 1.1 or less, chips can be stably laminated with a constant distance upon, for example, producing a multilayer semiconductor chip laminate by the method for producing a semiconductor chip laminate of the present invention. The "aspect ratio" used herein represents a ratio of a length of the major axis to a length of the minor axis of the particles (the value obtained by dividing the length of the major axis by the length of the minor axis). The spacer particles having an aspect ratio closer to 1 have a shape closer to the perfect sphere.

With respect to an amount of the spacer particles to be added in the adhesive for semiconductor components, the preferable lower limit thereof is 0.01% by weight and the preferable upper limit thereof is 5% by weight. In the case where the amount of the spacer particles is less than 0.01% by weight, a distance between chips may not be stably kept constant upon, for example, producing a multilayer semiconductor chip laminate by the method for producing a semiconductor chip laminate of the present invention. In the case where the amount of the spacer particles is more than 5% by weight, the function of the adhesive for semiconductor components as an adhesive may deteriorate.

In the case where the adhesive for semiconductor components contains a solid portion having a particle size equal to or larger than the average particle size of the spacer particles in addition to the spacer particles, the preferable upper limit of an amount of the solid portion to be added is 1% by weight.

A melting point of the solid portion having a particle size equal to or larger than the average particle size of the spacer particles is preferably equal to or less than a curing temperature of the adhesive for semiconductor components.

Furthermore, the maximum particle size of the solid portion having a particle size equal to or larger than the average particle size of the spacer particles is preferably 1.1 to 1.5 times, and more preferably 1.1 to 1.2 times, as large as the average particle size of the spacer particles.

The adhesive for semiconductor components preferably further contains a thixotropic agent. If the adhesive for semiconductor components contains the thixotropic agent, the adhesive can achieve a desired viscosity behavior.

The thixotropic agent is not particularly limited, and examples thereof include inorganic fine particles such as metal fine particles, calcium carbonate, fumed silica, aluminum oxide, boron nitride, alumimium nitride, and aluminum borate. Fumed silica is preferable among others.

Utilizable as the thixotropic agent is a thixotropic agent that is surface-treated if necessary. It is particularly preferable to use particles having a hydrophilic group on a surface thereof as the thixotropic agent. Specific examples of the particles having a hydrophilic group on the surface thereof include fumed silica having a hydrophilic group on the surface thereof.

In the case of using a particulate thixotropic agent as the thixotropic agent, the preferable upper limit of an average particle size is 1 µm. If the average particle size of the thixotropic agent exceeds 1 µm, the desired thixotropy property of the produced adhesive for semiconductor components may not be exerted.

An amount of the thixotropic agent in the adhesive for semiconductor components is not particularly limited. In the case where the spacer particles are not surface-treated, the preferable lower limit thereof is 0.5% by weight, and the preferable upper limit thereof is 20% by weight. If the amount of the thixotropic agent is less than 0.5% by weight, a sufficient thixotropy property may not be imparted to the produced adhesive for semiconductor components. If the amount of the thixotropic agent exceeds 20% by weight, the degree of excluding the adhesive for semiconductor components may be lowered upon producing a multilayer semiconductor chip laminate by the method for producing a semiconductor chip laminate of the present invention. The more preferable lower limit of the amount of the thixotropic agent is 3% by weight, and the more preferable upper limit thereof is 10% by weight.

The adhesive for semiconductor components preferably further contains a polymer compound having a functional group reactable with the curing compound. The adhesive containing such a polymer compound has bonding reliability improved upon occurrence of distortion by heat.

As a polymer compound having a functional group reactable with the curing compound, upon using an epoxy resin as the curing compound, there may be mentioned polymer compounds having an amino group, a urethane group, an imido group, a hydroxyl group, a carboxyl group, an epoxy group, and the like. The polymer compound having an epoxy group is preferable among these. Addition of the polymer compound having an epoxy group enables the cured material of the adhesive for semiconductor components to exhibit excellent flexibility. That is, since the cured material of the adhesive for semiconductor components simultaneously has: excellent mechanical strength, heat resistance, and moisture resistance derived from an epoxy resin (as the curing compound) having a polycyclic hydrocarbon skeleton as a main chain; and excellent flexibility derived from the polymer compound having an epoxy group, the cured material is excellent in resistance to thermal cycles, resistance to solder reflow, size stability, and the like, and provides high adhesion reliability and conduction reliability.

The polymer compound having an epoxy group is not particularly limited as long as it is a polymer compound having an epoxy group at its ends and/or side chains (pendant sites). Examples thereof include an epoxy group-containing acrylic rubber, an epoxy group-containing butadiene rubber, a bisphenol type high-molecular-weight epoxy resin, an epoxy group-containing phenoxy resin, an epoxy group-containing acrylic resin, an epoxy group-containing urethane resin, and an epoxy group-containing polyester resin. The epoxy group-containing acrylic resin is preferably used among these because it is possible to produce a polymer compound containing many epoxy groups and also a cured material having excellent mechanical strength and heat resistance. Each of these polymer compounds having an epoxy group may be used alone, or two or more of these may be used in combination.

In the case of using the polymer compound having an epoxy group, especially the epoxy group-containing acrylic resin, as the polymer compound having a functional group reactable with the curing compound, the preferable lower limit of a weight-average molecular weight of the polymer compound having an epoxy compound is 10,000. If the weight-average molecular weight is less than 10,000, film forming properties of the adhesive for semiconductor components are insufficient, so that the flexibility of the cured material of the adhesive for semiconductor components may not be sufficiently improved.

In the case of using the polymer compound having an epoxy group, especially an epoxy group-containing acrylic resin, as a polymer compound having a functional group reactable with the curing compound, the preferable lower limit of an epoxy equivalent of the polymer compound having an epoxy compound is 200, and the preferable upper limit thereof is 1,000. If the epoxy equivalent is less than 200, the flexibility of a cured material of the adhesive for semiconductor components may not be sufficiently improved. If the epoxy equivalent exceeds 1,000, the mechanical strength and heat resistance of the cured material of the adhesive for semiconductor components may be insufficient.

An amount of the polymer compound having a functional group reactable with the curing compound in the adhesive for semiconductor components is not particularly limited. The preferable lower limit thereof is 1 part by weight and the preferable upper limit thereof is 30 parts by weight, for 100 parts by weight of the curing compound. If the amount of the polymer compound having a functional group reactable with the curing compound is less than 1 part by weight, sufficient reliability for heat distortion may not be obtained. If the amount of the polymer compound having a functional group reactable with the curing compound exceeds 30 parts by weight, the heat resistance of the adhesive for semiconductor components may be lowered.

The adhesive for semiconductor components preferably further contains a surface-treated silica filler. The surface-treated silica filler is not particularly limited, and a silica filler surface-treated with a phenylsilane coupling agent is preferable.

An amount of the surface-treated silica filler in the adhesive for semiconductor components is not particularly limited. The preferable lower limit thereof is 30 parts by weight, and the preferable upper limit thereof is 400 parts by weight, for 100 parts by weight of the curing compound. If the amount of the surface-treated silica filler is less than 30 parts by weight, the produced adhesive for semiconductor components may not maintain sufficient reliability. If the amount of the surface-treated silica filler exceeds 400 parts by weight, the viscosity of the produced adhesive for semiconductor components may be too high, likely resulting in reduced application stability.

The adhesive for semiconductor components may contain a solvent, if needed.

The solvent is not particularly limited. Examples thereof include aromatic hydrocarbons, chlorinated aromatic hydrocarbons, chlorinated aliphatic hydrocarbons, alcohols, esters, ethers, ketones, glycol ethers (cellosolves), alicyclic hydrocarbons, and aliphatic hydrocarbons.

The adhesive for semiconductor components may contain an inorganic ion exchanger, if needed.

Examples of commercial products of the inorganic ion exchanger include IXE series (produced by Toagosei Co., Ltd.). In the adhesive for semiconductor components, the preferable upper limit of an amount of the inorganic ion exchanger is 10% by weight, and the preferable lower limit thereof is 1% by weight.

The adhesive for semiconductor components may contain other additives such as a bleed inhibitor and an adhesion providing agent including an imidazole silane coupling agent, if needed.

When measured by the E-type viscometer at 25° C., a viscosity of the adhesive for semiconductor components at 0.5 rpm is preferably 150 Pa·s or lower, and a viscosity thereof at 10 rpm is preferably 20 Pa·s or lower. If the viscosity at 0.5 rpm exceeds 150 Pa·s or the viscosity at 10 rpm exceeds 20 Pa·s, it may be difficult to apply the adhesive for semiconductor components in a desired shape; in addition, after the below-mentioned step (3) of uniformly wetting and spreading the adhesive for semiconductor components, the adhesive for semiconductor components may not uniformly wet and spread on the entire bonded region and may cause a cavity after mold sealing, likely resulting in lack of reliability of the produced semiconductor chip laminate. Upon, for example, producing a multilayer semiconductor chip laminate by the method for producing a semiconductor chip laminate of the present invention, the distance between chips may not be a distance substantially equal to the particle size of a spacer particle even upon application of pressure to the laminated semiconductor chip in the below-mentioned semiconductor chip laminating step (2).

When measured by the E-type viscometer at 25° C., the viscosity of the adhesive for semiconductor components at 0.5 rpm is more preferably 100 Pa·s or lower, and the viscosity thereof at 10 rpm is more preferably 15 Pa·s or lower.

When measured by the E-type viscometer at 25° C., the viscosity of the adhesive for semiconductor components at 0.5 rpm is preferably 10 Pa·s or higher, and the viscosity thereof at 10 rpm is preferably 0.1 Pa·s or higher. If the viscosity at 0.5 rpm is less than 10 Pa·s or the viscosity at 10 rpm is less than 0.1 Pa·s, it may be difficult to keep the shape formed at the time of application, until the below-mentioned semiconductor chip laminating step (2) after the application; in addition, after the below-mentioned step (3) of uniformly wetting and spreading the adhesive for semiconductor components, the amount of the adhesive for semiconductor components extending from the bonded region may increase, likely resulting in difficulty in wire bonding to the produced semiconductor chip laminate.

When measured by the E-type viscometer at 25° C., a viscosity of the adhesive for semiconductor components at 1 rpm is preferably two to five times as high as the viscosity thereof at 10 rpm. If the viscosity at 1 rpm is less than twice the viscosity at 10 rpm, it may be difficult to keep the drawing shape after application. If the viscosity at 1 rpm exceeds five times the viscosity at 10 rpm, after the below-mentioned step (3) of uniformly wetting and spreading the adhesive for semiconductor components, the adhesive for semiconductor components may not uniformly wet and spread on the entire bonded region and may cause a cavity after mold sealing, likely resulting in lack of reliability of the produced semiconductor chip laminate.

When measured by the E-type viscometer at 25° C., the viscosity of the adhesive for semiconductor components at 1 rpm is more preferably four times or lower than the viscosity thereof at 10 rpm.

In addition, when measured by the E-type viscometer at 80° C., a viscosity of the adhesive for semiconductor components at 0.5 rpm is preferably 1 Pa·s or higher and 30 Pa·s or lower. If the viscosity at 0.5 rpm is less than 1 Pa·s, after the below-mentioned step (3) of uniformly wetting and spreading the adhesive for semiconductor components, the amount of the adhesive for semiconductor components extending from the bonded region may increase, likely resulting in difficulty in wire bonding to the produced semiconductor chip laminate. If the viscosity at 0.5 rpm exceeds 30 Pa·s, after the below-mentioned step (3) of uniformly wetting and spreading the adhesive for semiconductor components, the adhesive for semiconductor components may not uniformly wet and spread on the entire bonded region and may cause a cavity after mold sealing, likely resulting in lack of reliability of the produced semiconductor chip laminate.

When measured by the E-type viscometer at 80° C., the viscosity of the adhesive for semiconductor components at 0.5 rpm is more preferably 3 Pa·s or higher and 25 Pa·s or lower, further preferably 5 Pa·s or higher and 20 Pa·s or lower, and even further preferably 6 Pa·s or higher and 15 Pa·s or lower With respect to an elastic modulus E of the adhesive for semiconductor components at −55° C. to 125° C. after cured, the preferable lower limit thereof is 1 GPa and the preferable upper limit thereof is 8 GPa. An elastic modulus E of less than 1 GPa may cause insufficient heat resistance. An elastic modulus E of more than 8 GPa may cause concentration of stresses generated by deformation due to temperature change, resulting in bad influence on bonding reliability. The more preferable lower limit of the elastic modulus E of the adhesive for semiconductor components at −55° C. to 125° C. after cured is 2 GPa and the more preferable upper limit thereof is 7 GPa.

A reaction rate of the adhesive for semiconductor components is preferably less than 5% after a lapse of 5 minutes at a temperature from 20° C. to 120° C. In the case where the reaction rate is 5% or more and a semiconductor chip laminate is produced by the method for producing a semiconductor chip laminate of the present invention, the adhesive for semiconductor components may wet and spread insufficiently, or a target reached level for spacers may not be obtained.

The method for producing the adhesive for semiconductor components is not particularly limited. Examples thereof include a method including blending and mixing, as needed, predetermined amounts of the curing accelerator, the polymer compound having a functional group reactable with a curing compound, the thixotropic agent, other additives, etc. into the adhesive composition containing a curing compound and a curing agent and thereafter blending spacer particles into the obtained mixture.

The mixing method is not particularly limited, and examples thereof include a method of using a homodisper, a universal mixer, a Banbury mixer, a kneader, or the like.

In the method for producing a semiconductor chip laminate of the present invention, subsequently, the semiconductor chip laminating step (2) in which the semiconductor chip is laminated on the substrate or another semiconductor chip via the adhesive for semiconductor components applied as mentioned above is performed.

In the semiconductor chip laminating step (2), the semiconductor chip is laminated by aligning the semiconductor chip with the substrate or another semiconductor chip via the applied adhesive for semiconductor components.

Immediately after the semiconductor chip laminating step (2), the area with the adhesive for semiconductor components wetting and spreading thereon is 60% or more and less than 100% of the bonded region.

If the area with the adhesive for semiconductor components wetting and spreading thereon is less than 60% of the bonded region, after the below-mentioned step (3) of uniformly wetting and spreading the adhesive for semiconductor components, the adhesive for semiconductor components does not uniformly wet and spread on the entire bonded region, resulting in lack of reliability of the produced semiconductor chip laminate. If the area with the adhesive for semiconductor components wetting and spreading thereon is 100% or more of the bonded region, after the below-mentioned step (3) of uniformly wetting and spreading the adhesive for semiconductor components, the amount of the adhesive for semiconductor components extending from the bonded region increases, resulting in difficulty in wire bonding to the produced semiconductor chip laminate.

FIG. 1 schematically illustrates a state immediately after the semiconductor chip laminating step (2) in the method for producing a semiconductor chip laminate of the present invention. In FIG. 1, a semiconductor chip 2 is laminated on a substrate or another semiconductor chip 1 via an adhesive for semiconductor components 3 applied.

It is preferable to press the semiconductor chip laminated on the substrate or another semiconductor chip in the semiconductor chip laminating step (2). The pressing causes the adhesive for semiconductor components to uniformly wet and spread in a predetermined range of the bonded region. In addition, in the case where the adhesive for semiconductor components contains the spacer particles, the semiconductor chip can be laminated so that the distance between semiconductor chips may be maintained by the spacer particles.

The pressing is preferably performed at a pressure of 0.01 MPa to 1.0 MPa for 0.1 seconds to 5 seconds. The pressing under the conditions of the pressure and time in the above range enables the adhesive for semiconductor components to uniformly wet and spread in 60% or more and less than 100% of the bonded region. The pressing is more preferably performed at a pressure of 0.05 MPa to 0.5 MPa.

In the semiconductor chip laminating step (2), upon, for example, producing a multilayer semiconductor chip laminate by the method for producing a semiconductor chip laminate of the present invention, for example, it is preferable that the pressing reduces the distance between chips to one to three times as large as the desired distance between chips. Here, in the case where the adhesive for semiconductor components contains the spacer particles and the distance between chips is larger than the particle size of the spacer particles, the difference between the distance between chips and the particle size of the spacer particles is preferably set to 10 μm or less when the adhesive for semiconductor components is uniformly wetted and spread on the entire bonded region in the below-described step (3) of uniformly wetting and spreading the adhesive for semiconductor components.

In the method for producing a semiconductor chip laminate of the present invention, subsequently, the step (3) of uniformly wetting and spreading the adhesive for semiconductor components is performed on the entire region for bonding the semiconductor chip located on the substrate or another semiconductor chip, that is, the entire bonded region.

In the step (3) of uniformly wetting and spreading the adhesive for semiconductor components, when measured by the E type viscometer, the viscosity of the adhesive for semiconductor components between the substrate or another semiconductor chip and the semiconductor chip at 0.5 rpm is 1 Pa·s to 30 Pa·s.

By setting the viscosity of the adhesive for semiconductor components in the above range, it is possible to uniformly wet and spread the adhesive for semiconductor components on the entire bonded region. In this case, the adhesive for semiconductor components is held by surface tension between the substrate or another semiconductor chip and the semiconductor chip. When the adhesive for semiconductor components is cured in the below-described curing step (4) while being held in such a way, the amount of the adhesive for semiconductor components extending from the bonded region can be adjusted.

FIG. 2 schematically illustrates a state immediately after the step (3) of uniformly wetting and spreading the adhesive for semiconductor components in the method for producing a semiconductor chip laminate of the present invention. In FIG. 2, the adhesive for semiconductor components 3 wets and spreads on the entire bonded region and is held by surface tension between the substrate or another semiconductor chip 1 and the semiconductor chip 2. FIG. 3 schematically illustrates a state where the step (3) of uniformly wetting and spreading the adhesive for semiconductor components is not performed appropriately, the adhesive for semiconductor components 3 is not held by surface tension, and the adhesive for semiconductor components 3 extends from the bonded region of the semiconductor chip 2. In the case where the amount of the adhesive for semiconductor components extending from the bonded region increases, it is difficult to wire bond to the produced semiconductor chip laminate.

In the case where, when measured by the E type viscometer, the viscosity of the adhesive for semiconductor components at 0.5 rpm is less than 1 Pa·s in the step (3) of uniformly wetting and spreading the adhesive for semiconductor components, the amount of the adhesive for semiconductor components extending from the bonded region increases, resulting in difficulty in wire bonding to the produced semiconductor chip laminate. In the case where, when measured by the E type viscometer, the viscosity of the adhesive for semiconductor components at 0.5 rpm exceeds 30 Pa·s in the step (3) of uniformly wetting and spreading the adhesive for semiconductor components, the adhesive for semiconductor components does not uniformly wet and spread on the entire bonded region, and causes a cavity after mold sealing, resulting in lack of reliability of the produced semiconductor chip laminate.

In the step (3) of uniformly wetting and spreading the adhesive for semiconductor components, a fillet preferably partially extends from two or more sites of the bonded region.

The "fillet" used herein refers to a thick portion of the adhesive for semiconductor components extending from the bonded region. The expression "a fillet partially extends from two or more sites of the bonded region" used herein means that a fillet partially extends from two or more sites of a portion of the bonded region such as (a) corner(s) or side(s), not the entire periphery of the bonded region.

In the step (3) of uniformly wetting and spreading the adhesive for semiconductor components, the amount of the adhesive for semiconductor components extending from the bonded region, that is, the amount of the fillet can be adjusted by uniformly wetting and spreading the adhesive for semiconductor components on the entire bonded region. However, in the process of wetting and spreading the adhesive for semiconductor components on the entire bonded region, the position shift of the semiconductor chip, that is, the chip shift may occur.

In the step (3) of uniformly wetting and spreading the adhesive for semiconductor components, when the adhesive for semiconductor components is uniformly wetted and spread while a fillet partially extends from two or more sites of the bonded region, a chip shift can be suppressed while good wire bonding can be achieved even in the miniaturized semiconductor chip laminate with the amount of the fillet adjusted therein. Therefore, the reliability of the produced semiconductor chip laminate can be further improved.

In the case where a fillet partially extends only from one site of the bonded region, the semiconductor chip may rotate on the adhesive for semiconductor components, and the chip shift may not be sufficiently suppressed.

As the two or more sites of the bonded region, a pair of symmetrically located corners, sides, portions of sides, or the like, and a combination of such pairs are preferable since the chip shift can be suppressed more favorably.

In the case where semiconductor chips are laminated stepwise on a semiconductor chip, a fillet extends partially from two or more sites of the lower side of a second tier of the semiconductor chips on an overlap between a first tier and the second tier of the semiconductor chips, whereby the chip shift can be suppressed effectively.

In order to allow the fillet to partially extend from two or more sites of the bonded region in the step (3) of uniformly wetting and spreading the adhesive for semiconductor components, for example, the adhesive for semiconductor components is preferably applied in a symmetrical shape in the application step (1).

The symmetrical shape is not particularly limited, and examples thereof include shapes illustrated in FIGS. 4, 6, 8, 10, 12, and 14. For example, in the case where the adhesive for semiconductor components is applied in a shape illustrated in FIG. 4 in the application step (1), the area with the adhesive for semiconductor components wetting and spreading thereon forms a shape illustrated in FIG. 5 immediately after the semiconductor chip laminating step (2). Subsequently, in the step (3) of uniformly wetting and spreading the adhesive for semiconductor components, it is possible to uniformly wet and spread the adhesive for semiconductor components while the fillet partially extends from two or more sites of the bonded region. Similarly, in the case where the adhesive for semiconductor components is applied in shapes illustrated in FIG. 6, FIG. 8, FIG. 10, FIG. 12, and FIG. 14 in the application step (1), for example, the shapes of the area with the adhesive for semiconductor components wetting and spreading thereon immediately after the semiconductor chip laminating step (2) correspond to the shapes illustrated in FIG. 7, FIG. 9, FIG. 11, FIG. 13, and FIG. 15, respectively.

The size of the fillet is not particularly limited. The preferable lower limit of the distance of the fillet (fillet distance) from the bonded region is 50 μm, and the preferable upper limit thereof is 300 μm. A fillet distance from the bonded region of less than 50 μm may result in insufficient effects of forming the fillet. A fillet distance from the bonded region exceeding 300 μm may cause the fillet to contaminate a wire bonding pad, likely leading to poor wire bonding.

The more preferable lower limit of the fillet distance from the bonded region is 100 μm, the more preferable upper limit thereof is 300 μm, the further preferable lower limit thereof is 150 μm, and the further preferable upper limit thereof is 300 μm.

The step (3) of uniformly wetting and spreading the adhesive for semiconductor components is not particularly limited provided that it is possible to uniformly wet and spread the adhesive for semiconductor components.

As the step (3) of uniformly wetting and spreading the adhesive for semiconductor components, for example, an ordinary temperature step of performing ordinary temperature treatment of the adhesive for semiconductor components between the substrate or another semiconductor chip and the semiconductor chip may be performed.

The "ordinary temperature treatment" used herein refers to treatment of keeping an ordinary temperature for a predetermined period of time. The ordinary temperature means a temperature at which no particular heat is applied, and specific examples thereof include temperatures in the range of 0° C. to 40° C.

The step (3) of uniformly wetting and spreading the adhesive for semiconductor components may include: a step (3-1) of heating the adhesive for semiconductor components between the substrate or another semiconductor chip and the semiconductor chip; and a step (3-2) of heat-retaining the heated adhesive for semiconductor components.

The "heating" treatment used herein refers to treatment of gradually applying heat under conditions such as a predetermined temperature, time, and heating speed.

The heating treatment method is not particularly limited, and examples thereof include a method of raising temperature from an ordinary temperature to 80° C. over 30 minutes.

In the heat-retaining step (3-2), the adhesive for semiconductor components uniformly wets and spreads on the entire bonded region. Therefore, the adhesive for semiconductor components can be gelled while being held by surface tension between the substrate or another semiconductor chip and the semiconductor chip.

The "heat-retaining" used herein refers to treatment of keeping temperature under temperature conditions reached in the heating step (3-1) for a predetermined period of time.

The heat-retaining method is not particularly limited, and examples thereof include a method of keeping temperature in an oven at 80° C. over 60 minutes.

In order to perform the step (3) of uniformly wetting and spreading the adhesive for semiconductor components, it is preferable to measure beforehand the viscosity of the adhesive for semiconductor components at 0.5 rpm with the E type viscometer and find the temperatures at which the viscosity falls within the range of 1 Pa·s to 30 Pa·s.

In the method for producing a semiconductor chip laminate of the present invention, subsequently, the step (4) of curing the adhesive for semiconductor components is performed. By performing the curing step (4), the adhesive for semiconductor components can be cured to produce a semiconductor chip laminate.

The curing method in the curing step (4) is not particularly limited. The curing conditions suited to curing characteristics of the adhesive for semiconductor components can be appropriately selected, and there may be mentioned, for example, a method of heating at 120° C. for 30 minutes and at 170° C. for 30 minutes.

Upon producing a multilayer semiconductor chip laminate by the method for producing a semiconductor chip laminate of the present invention, the step (3) of uniformly wetting and spreading the adhesive for semiconductor components and the curing step (4) may be performed every time one semiconductor chip is laminated, or may be performed at a time after repeating lamination of a desired number of semiconductor chips.

Upon producing a multilayer semiconductor chip laminate by the method for producing a semiconductor chip laminate of the present invention, variations 3σ in the distance between chips of the semiconductor chip laminate produced after the curing step (4) are preferably less than μm. Variations 3σ of 5 μm or more may cause poor wire bonding and poor flip chip bonding of the produced semiconductor chip laminate. Here, σ represents a standard deviation.

In the method for producing a semiconductor chip laminate of the present invention, the step (3) of uniformly wetting and spreading the adhesive for semiconductor components and the curing step (4) may be performed as a series of steps or as different steps. Similarly, the heating step (3-1) and the heat-retaining step (3-2), for example, may be performed as a series of steps or as different steps. In either case, when the temperature, time, and heating speed are appropriately selected in each step, it is important to cure the adhesive for semiconductor components with the adhesive uniformly wetting and spreading in the entire bonded region, or with the fillet partially extending from two or more sites of the bonded region and the adhesive for semiconductor components uniformly wetting and spreading on the entire bonded region.

In the method for producing a semiconductor chip laminate of the present invention, a semiconductor chip may be bonded to a substrate to produce a semiconductor chip laminate, or for example, a semiconductor chip may be bonded to another semiconductor chip such as a semiconductor chip bonded to the substrate to produce a multilayer semiconductor chip laminate. The method for producing a semiconductor chip laminate of the present invention can be especially favorably used upon laminating semiconductor chips in a crisscross manner.

It is possible to produce a semiconductor chip laminate by the method for producing a semiconductor chip laminate of the present invention, and also to produce a semiconductor device by sealing the produced semiconductor chip laminate with a sealing material or the like. Such a semiconductor device is also one aspect of the present invention.

Effects of the Invention

The present invention provides a method for producing a semiconductor chip laminate, which adjusts the amount of an adhesive for semiconductor components extending from a bonded region of a semiconductor chip and provides a smaller but highly-precise and highly-reliable semiconductor chip laminate. The present invention also provides a semiconductor device, which is produced by the method for producing the semiconductor chip laminate according to the present invention.

MODES FOR CARRYING OUT THE INVENTION

The present invention will be further described hereinbelow with reference to examples, but not limited to these examples.

For measurement of a particle size in each of the following examples and comparative examples, a particle size measuring apparatus (Coulter counter ZB/C-1000, produced by Coulter Electronics Ltd.) was used.

Example 1

(1) Production of Adhesive for Semiconductor Components

Figure 16:
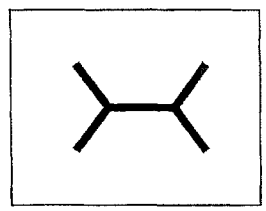
FIG. 16 is a top view schematically illustrating one example of the shape of the adhesive for semiconductor components to be applied to the bonded region in the application step (1) in the method for producing a semiconductor chip laminate of the present invention.

According to each formulation of Example 1 shown in Table 1, the below-mentioned materials other than the spacer particles were mixed under stirring with a homodisper to prepare an adhesive composition. To the produced adhesive composition was added the spacer particles according to the formulation shown in Table 1, and then the mixture was further mixed under stirring with the homodisper to prepare an adhesive for semiconductor components.
1. Epoxy Resin
   Bisphenol F type epoxy resin (EXA-830-CRP, produced by DIC Corporation)
   Resorcinol type epoxy resin (EX-201, produced by Nagase ChemteX Corporation)
   Polyether type epoxy resin (Epogosey PT, produced by Yokkaichi Chemical Company, Limited)
2. Epoxy Group-Containing Polymer Compound
   Epoxy group-containing acrylic resin (Blemmer CP-30, produced by NOF Corporation)
3. Rubber-Modified Epoxy Resin
   NBR-modified epoxy resin (EPR-4033, produced by ADEKA Corporation)
4. Curing Agent
   Acid anhydride (YH-306, produced by Japan Epoxy Resins Co., Ltd.)
5. Curing Accelerator
   Imidazole compound (2MA-OK, produced by Shikoku Chemicals Corporation)
6. Adhesive Providing Agent
   Imidazole silane coupling agent (SP-1000, produced by Nikko Materials Co., Ltd.)
7. Thixotropic Agent
   Fumed silica (thixotropic agent containing a hydrophilic group on a surface thereof, QS-40, produced by TOKUYAMA Corp.)
8. Spacer Particles
   Resin particles (Micropearl SP-210, produced by Sekisui Chemical Co., Ltd., average particle size=10 μm. CV value=4%)
9. Silica Filler
   Spherical silica (SE-4050-SPE, produced by Admatechs, average particle size=1 μm, maximum particle size ~5 μm)
(2) Production of Semiconductor Chip Laminate The produced adhesive for semiconductor components was filled into a 10 mL syringe (produced by Iwashita Engineering, Inc.), a precision nozzle (produced by Iwashita Engineering, Inc., nozzle tip diameter: 0.3 mm) was attached to the tip of the syringe, and the adhesive in a shape illustrated in FIG. 16 was applied to a glass substrate in an application amount of 3.3 μL at a discharge pressure of 0.4 MPa by using a dispenser device (SHOT MASTER300, produced by Musashi Engineering, Inc.), with a gap between a semiconductor chip and a needle being set to 200 μm.

In this case, the area with the adhesive for semiconductor components applied thereon was 50% of the bonded region.

Via the applied adhesive for semiconductor components, a semiconductor chip (chip 1) (thickness: 80 μm, 8 mm×12 mm, mesh-like pattern, aluminum wiring (thickness: 0.7 μm), L/S=15/15, thickness of a silicon nitride film on the surface thereof: 1.0 μm) having 172 pieces of 110 μm pad openings in a peripheral shape was pressed at a pressure of 0.3 MPa for 0.5 seconds by using a flip chip bonder (DB-100, produced by Shibuya Kogyo Co., Ltd.), and thereby laminated on the glass substrate.

Figure 17:
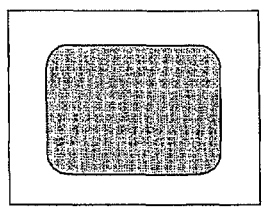
FIG. 17 is a top view schematically illustrating one example of the shape of the adhesive for semiconductor components that has wetted and spread in the bonded region immediately after the semiconductor chip laminating step (2) in the method for producing a semiconductor chip laminate of the present invention.

In this case, the area with the adhesive for semiconductor components wetting and spreading thereon was 70% of the bonded region and had a shape illustrated in FIG. 17.

Then, in a hot air blow drying furnace, heating treatment was performed by raising the temperature from an ordinary temperature to 80° C. over 30 minutes, the resultant product was left standing at 80° C. for 60 minutes for heat-retaining, heating was performed thereon at 150° C. for 60 minutes, and the adhesive for semiconductor components was cured to produce a semiconductor chip laminate.

Example 2

Figure 18:
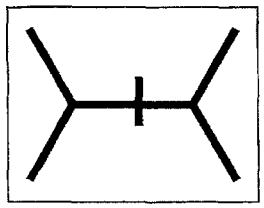
FIG. 18 is a top view schematically illustrating one example of the shape of the adhesive for semiconductor components to be applied to the bonded region in the application step (1) in the method for producing a semiconductor chip laminate of the present invention.
Figure 19:
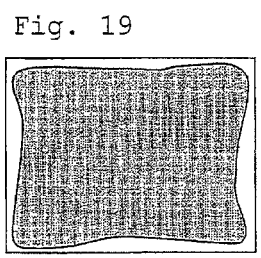
FIG. 19 is a top view schematically illustrating one example of the shape of the adhesive for semiconductor components that has wetted and spread in the bonded region immediately after the semiconductor chip laminating step (2) in the method for producing a semiconductor chip laminate of the present invention.

An adhesive for semiconductor components and a semiconductor chip laminate were produced as in Example 1, except that an area with the adhesive for semiconductor components applied thereon was 90% of a bonded region and the application shape was a shape illustrated in FIG. 18, and that, immediately after laminating a semiconductor chip (chip 1) on the glass substrate via the applied adhesive for semiconductor components, an area with the adhesive for semiconductor components wetting and spreading thereon was 95% of the bonded region and had a shape illustrated in FIG. 19.

Example 3

An adhesive for semiconductor components and a semiconductor chip laminate were produced as in Example 1, except that an adhesive composition was produced based on the formulation of Example 3 in Table 1.

Example 4

An adhesive for semiconductor components and a semiconductor chip laminate were produced as in Example 2, except that an adhesive composition was produced based on the formulation of Example 4 in Table 1.

Example 5

An adhesive for semiconductor components and a semiconductor chip laminate were produced as in Example 1, except that an adhesive composition was produced based on the formulation of Example 5 in Table 1, and that ordinary temperature treatment was performed for 30 minutes instead of heating treatment and heat-retaining.

Example 6

An adhesive for semiconductor components and a semiconductor chip laminate were produced as in Example 1, except that an adhesive composition was produced based on the formulation of Example 6 in Table 1, and that ordinary temperature treatment was performed for 30 minutes instead of heating treatment and heat-retaining.

Example 7

Figure 1:
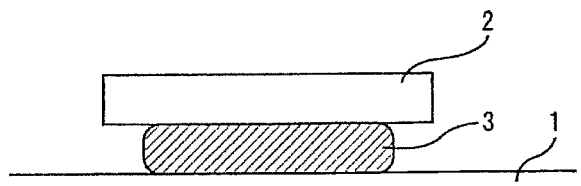
FIG. 1 is a cross-sectional view schematically illustrating a state immediately after a semiconductor chip laminating step (2) in the method for producing a semiconductor chip laminate of the present invention.
Figure 2:
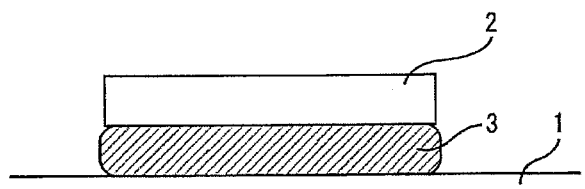
FIG. 2 is a cross-sectional view schematically illustrating a state immediately after a step (3) of uniformly wetting and spreading an adhesive for semiconductor components in the method for producing a semiconductor chip laminate of the present invention.
Figure 3:
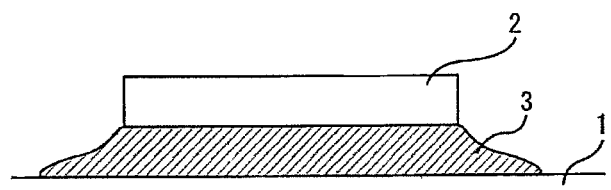
FIG. 3 is a cross-sectional view schematically illustrating a state where the adhesive for semiconductor components extends from a bonded region of the semiconductor chip.
Figure 4:
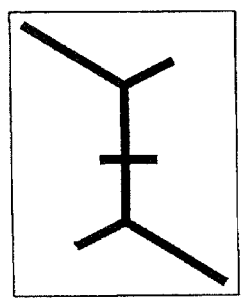
FIG. 4 is a top view schematically illustrating one example of the shape of the adhesive for semiconductor components to be applied to the bonded region in an application step (1) in the method for producing a semiconductor chip laminate of the present invention.

A semiconductor chip laminate was produced as in Example 3, except that upon applying an adhesive for semiconductor components to a glass substrate, the adhesive for semiconductor components was applied in the shape illustrated in FIG. 4. Immediately after laminating a semiconductor chip (chip 1) on the glass substrate, an area with the adhesive for semiconductor components wetting and spreading in a bonded region had a shape illustrated in FIG. 5, and a fillet was formed.

Examples 8 to 10

A semiconductor chip laminate was produced as in Example 7, except that upon applying an adhesive for semiconductor components to a glass substrate, the adhesive for semiconductor components was applied in the shape corresponding to each of the drawings shown in Table 2, and that a semiconductor chip (chip 1) having a size of 10 mm×10 mm was used. Immediately after laminating a semiconductor chip (chip 1) on the glass substrate, an area with the adhesive for semiconductor components wetting and spreading in a bonded region had a shape corresponding to each of the drawings shown in Table 2, and a fillet was formed.

Examples 11 and 12

A semiconductor chip laminate was produced as in Example 7, except that upon applying an adhesive for semiconductor components to a glass substrate, the adhesive for semiconductor components was applied in the shape corresponding to each of the drawings shown in Table 2. Immediately after laminating a semiconductor chip (chip 1) on the glass substrate, an area with the adhesive for semiconductor components wetting and spreading in a bonded region had a shape corresponding to each of the drawings shown in Table 2, and a fillet was formed.

Comparative Example 1

An adhesive for semiconductor components and a semiconductor chip laminate were produced as in Example 1, except that an area with the adhesive for semiconductor components applied thereon was 20% of a bonded region, and that an area with the adhesive for semiconductor components wetting and spreading thereon was 40% of the bonded region immediately after laminating a semiconductor chip (chip 1) on a glass substrate via the applied adhesive for semiconductor components.

Comparative Example 2

An adhesive for semiconductor components and a semiconductor chip laminate were produced as in Example 1, except that an area with the adhesive for semiconductor components applied thereon was 95% of a bonded region, and that an area with the adhesive for semiconductor components wetting and spreading thereon was 110% of the bonded region immediately after laminating a semiconductor chip (chip 1) on a glass substrate via the applied adhesive for semiconductor components.

Comparative Example 3

An adhesive for semiconductor components and a semiconductor chip laminate were produced as in Example 1, except that an adhesive composition was produced based on the formulation of Comparative Example 3 in Table 3.

Comparative Example 4

An adhesive for semiconductor components and a semiconductor chip laminate were produced as in Example 1, except that an adhesive composition was produced based on the formulation of Comparative Example 4 in Table 3.

Comparative Example 5

An adhesive for semiconductor components and a semiconductor chip laminate were produced as in Example 1, except that an adhesive composition was produced based on the formulation of Comparative Example 5 in Table 3, and that ordinary temperature treatment was performed for 30 minutes instead of heating treatment and heat-retaining.

Comparative Example 6

An adhesive for semiconductor components and a semiconductor chip laminate were produced as in Example 1, except that an adhesive composition was produced based on the formulation of Comparative Example 6 in Table 3, and that ordinary temperature treatment was performed for 30 minutes instead of heating treatment and heat-retaining.

(Evaluation)

The adhesive for semiconductor components and the semiconductor chip laminates produced in examples and comparative examples were evaluated by the following method. Tables 1, 2, and 3 show the results.

(1) Measurement of Viscosity

Using an E type viscometer (trade name: "VISCOMETER TV-22", produced by TOKI SANGYO CO., LTD, rotor used: φ15 mm, set temperature: 25° C.), measurements were made on a viscosity (A) at 0.5 rpm, a viscosity (B) at 1 rpm, and a viscosity (C) at 10 rpm in the produced adhesive for semiconductor components. Also, (B/C) were calculated as a ratio of the viscosity (B) at 1 rpm to the viscosity (C) at 10 rpm.

Using an E type viscometer (trade name: "VISCOMETER TV-22", produced by TOKI SANGYO CO., LTD, rotor used: φ15 mm, set temperature: 80° C.), measurements were made on a viscosity at 0.5 rpm in the produced adhesive for semiconductor components.

(2) Filling Properties of Adhesive for Semiconductor Components

Filling properties of the adhesive for semiconductor components in a bonded region between a glass substrate and a semiconductor chip (chip 1) was evaluated based on the following criteria.
  ⊚ Seen from the glass substrate, the entire bonded region was filled with the adhesive for semiconductor components.
  x Seen from the glass substrate, some of the bonded region was not filled with the adhesive for semiconductor components.

(3) Extension of Adhesive for Semiconductor Components (Fillet Distance)

Extension of the adhesive for semiconductor components (fillet distance) was evaluated based on the following criteria by determining the maximum extension distance (fillet distance) of the adhesive for semiconductor components extending from the bonded region between the glass substrate and the semiconductor chip (chip 1).
  ○ The maximum extension distance was 1 μm to 100 μm.
  ⊚ The maximum extension distance was 101 μm to 200 μm.
  Δ The maximum extension distance was 201 μm to 300 μm.
  x The maximum extension distance was 301 μm or higher, or the maximum extension distance was 0 μm without the entire bonded region filled with the adhesive for semiconductor components.

(4) Variations in Distance Between Chips, and Reached Level for Spacers

Ten samples of the produced semiconductor chip laminates were produced, and lamination condition of each semiconductor chip laminate was determined with a laser displacement gauge (KS-1100, produced by KEYENCE Corporation). Specifically, a level difference between the upper surfaces of the chip 1 and the glass was measured, a distance between the chip 1 and the glass was determined by subtracting a chip thickness from the measured value, and thereby variations in the distance between chips were calculated as 3σ (μm) (σ=standard deviation). The "distance between chips" used herein means both the distance between a substrate and a semiconductor chip and the distance between semiconductor chips.

Moreover, (the distance between chips/the average particle size of spacer particles) was calculated as reached level for spacers.

(5) Reflow Resistance Test

Each of the produced semiconductor chip laminates was dried at 125° C. for 6 hours and subjected to a 48-hour treatment at 85° C. at a humidity of 85%, and subsequently heating was carried out thereon under conditions of 260° C. for 30 seconds, the same conditions as those upon solder reflowing. Then, the semiconductor chip laminate subjected to such heating three times was observed as to the occurrence of interlayer peeling. The interlayer peeling was observed with an ultrasonic imaging device (mi-scope hyper II, produced by Hitachi Kenki FineTech Co., Ltd.).

Reflow resistance of the semiconductor chip laminates was evaluated by assessing interlayer peeling by the following criteria.
  ⊚ Interlayer peeling was hardly observed.
  Δ Interlayer peeling was slightly observed.
  x Interlayer peeling was markedly observed.

(6) Measurement of Chip Shift Distance

Immediately after laminating the semiconductor chip on the glass substrate via the applied adhesive for semiconductor components, a distance between a corner of the glass substrate and a corner of the semiconductor chip was measured. Thereafter, a distance between a corner of the glass substrate and a corner of the semiconductor chip in the semiconductor chip laminate produced after the curing step was measured. The difference between these two distances was regarded as a chip shift distance, and evaluated by the following criteria.
  ○ The chip shift distance was 1 μm to 10 μm.
  ⊚ The chip shift distance was 11 μm to 20 μm.
  Δ The chip shift distance was 21 μm to 50 μm.
  x The chip shift distance was 51 μm or higher.

TABLE 1

|  |  |  | Example 1 | Example 2 | Example 3 | Example 4 | Example 5 | Example 6 |
|---|---|---|---|---|---|---|---|---|
| Formulation of adhesive (parts by weight) | Bisphenol F type epoxy resin | EXA-830-CRP | 4 | 4 | 0 | 0 | 0 | 4 |
| | Resorcinol type epoxy resin | EX-201 | 4 | 4 | 1 | 1 | 1 | 4 |
| | Polyether type epoxy resin | Epogosey PT | 0 | 0 | 7 | 7 | 7 | 0 |
| | Epoxy group-containing acrylic resin | Blemmer CP-30 | 1 | 1 | 2 | 2 | 2 | 1 |
| | NBR-modified epoxy resin | EPR-4033 | 1 | 1 | 0 | 0 | 0 | 1 |
| | Curing agent | YH-306 | 8 | 8 | 4 | 4 | 4 | 8 |
| | Curing accelerator | 2MA-OK | 0.4 | 0.4 | 0.4 | 0.4 | 0.4 | 0.4 |
| | Adhesive providing agent | SP-1000 | 0.1 | 0.1 | 0.1 | 0.1 | 0.1 | 0.1 |
| | Thixotropic agent | QS-40 | 0.6 | 0.6 | 0.5 | 0.5 | 0.1 | 0.2 |
| | Spacer particle | Micropearl SP-210 | 0.1 | 0.1 | 0.1 | 0.1 | 0.1 | 0.1 |
| | Silica filler | SE-4050-SPE | 0 | 0 | 15 | 15 | 10 | 0 |
| Process conditions | Application step (1) | Area with adhesive applied thereon (%) | 50 | 90 | 50 | 90 | 50 | 50 |
| | Semiconductor chip laminating step (2) | Area with adhesive wetting and spreading thereon (%) | 70 | 95 | 70 | 95 | 70 | 70 |
| | Step (3) of uniformly wetting and spreading adhesive for semiconductor components | Viscosity (0.5 rpm) (Pa·s) | 6 | 6 | 7 | 7 | 25 | 27 |
| | | Treatment | Heat-retaining | Heat-retaining | Heat-retaining | Heat-retaining | Ordinary temperature | Ordinary temperature |
| | | Heat-retaining temperature (° C.) | 80 | 80 | 80 | 80 | — | — |
| Viscosity of adhesive | Viscosity (25° C.) (Pa·s) | (A) 0.5 rpm | 60 | 60 | 40 | 40 | 25 | 27 |
| | | (B) 1 rpm | 35 | 35 | 22 | 22 | 18 | 15 |
| | | (C) 10 rpm | 7 | 7 | 8 | 8 | 9 | 7 |
| | | (B)/(C) | 5 | 5 | 2.75 | 2.75 | 2 | 2.1 |
| | Viscosity (80° C.) (Pa·s) | 0.5 rpm | 6 | 6 | 7 | 7 | 4 | 3 |

TABLE 1-continued

|  | Example 1 | Example 2 | Example 3 | Example 4 | Example 5 | Example 6 |
|---|---|---|---|---|---|---|
| Filling properties of adhesive for semiconductor components | ○ | ○ | ○ | ○ | ○ | ○ |
| Extension of adhesive for semiconductor components | ○ | ○ | ◎ | ○ | ◎ | ○ |
| Variations in distance between chips (μm) | 7 | 5 | 8 | 6 | 8 | 5 |
| Reached level for spacers | 1.5 | 1.3 | 1.7 | 1.5 | 1.7 | 1.3 |
| Reflow resistance | ○ | ○ | ○ | ○ | ○ | ○ |
| Chip shift distance | ○ | ○ | ○ | ○ | ○ | ○ |

TABLE 2

Figure 5:
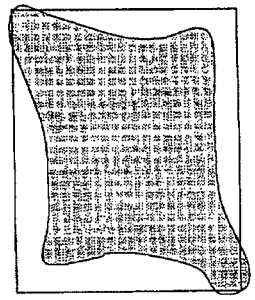
FIG. 5 is a top view schematically illustrating one example of the shape of the adhesive for semiconductor components that has wetted and spread in the bonded region immediately after the semiconductor chip laminating step (2) in the method for producing a semiconductor chip laminate of the present invention.
Figure 6:
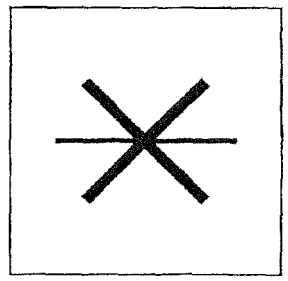
FIG. 6 is a top view schematically illustrating one example of the shape of the adhesive for semiconductor components to be applied to the bonded region in the application step (1) in the method for producing a semiconductor chip laminate of the present invention.
Figure 7:
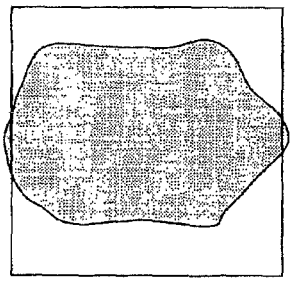
FIG. 7 is a top view schematically illustrating one example of the shape of the adhesive for semiconductor components that has wetted and spread in the bonded region immediately after the semiconductor chip laminating step (2) in the method for producing a semiconductor chip laminate of the present invention.
Figure 8:
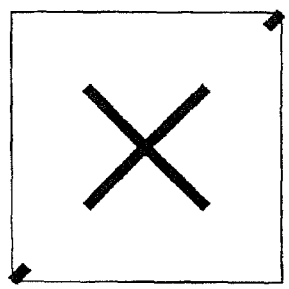
FIG. 8 is a top view schematically illustrating one example of the shape of the adhesive for semiconductor components to be applied to the bonded region in the application step (1) in the method for producing a semiconductor chip laminate of the present invention.
Figure 9:
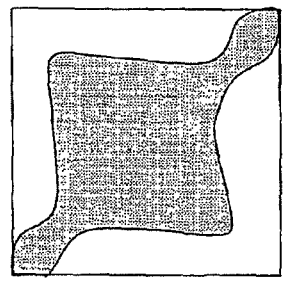
FIG. 9 is a top view schematically illustrating one example of the shape of the adhesive for semiconductor components that has wetted and spread in the bonded region immediately after the semiconductor chip laminating step (2) in the method for producing a semiconductor chip laminate of the present invention.
Figure 10:
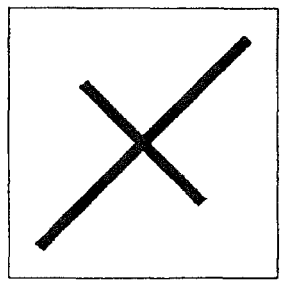
FIG. 10 is a top view schematically illustrating one example of the shape of the adhesive for semiconductor components to be applied to the bonded region in the application step (1) in the method for producing a semiconductor chip laminate of the present invention.
Figure 11:
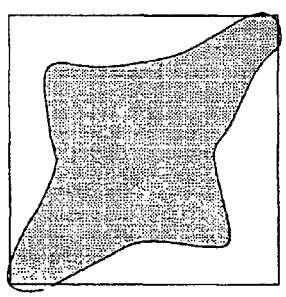
FIG. 11 is a top view schematically illustrating one example of the shape of the adhesive for semiconductor components that has wetted and spread in the bonded region immediately after the semiconductor chip laminating step (2) in the method for producing a semiconductor chip laminate of the present invention.
Figure 12:
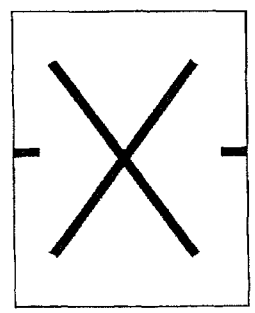
FIG. 12 is a top view schematically illustrating one example of the shape of the adhesive for semiconductor components to be applied to the bonded region in the application step (1) in the method for producing a semiconductor chip laminate of the present invention.
Figure 13:
FIG. 13 is a top view schematically illustrating one example of the shape of the adhesive for semiconductor components that has wetted and spread in the bonded region immediately after the semiconductor chip laminating step (2) in the method for producing a semiconductor chip laminate of the present invention.
Figure 14:
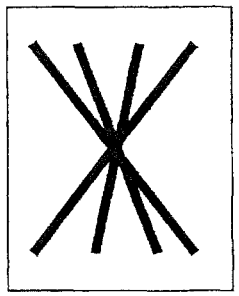
FIG. 14 is a top view schematically illustrating one example of the shape of the adhesive for semiconductor components to be applied to the bonded region in the application step (1) in the method for producing a semiconductor chip laminate of the present invention.
Figure 15:
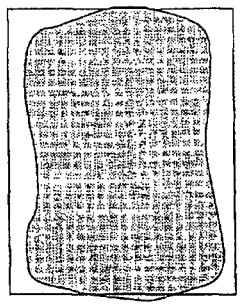
FIG. 15 is a top view schematically illustrating one example of the shape of the adhesive for semiconductor components that has wetted and spread in the bonded region immediately after the semiconductor chip laminating step (2) in the method for producing a semiconductor chip laminate of the present invention.

| | | | Example 7 | Example 8 | Example 9 | Example 10 | Example 11 | Example 12 |
|---|---|---|---|---|---|---|---|---|
| Formulation of adhesive (parts by weight) | Bisphenol F type epoxy resin | EXA-830-CRP | 0 | 0 | 0 | 0 | 0 | 0 |
| | Resorcinol type epoxy resin | EX-201 | 1 | 1 | 1 | 1 | 1 | 1 |
| | Polyether type epoxy resin | Epogosey PT | 7 | 7 | 7 | 7 | 7 | 7 |
| | Epoxy group-containing acrylic resin | Blemmer CP-30 | 2 | 2 | 2 | 2 | 2 | 2 |
| | NBR-modified epoxy resin | EPR-4033 | 0 | 0 | 0 | 0 | 0 | 0 |
| | Curing agent | YH-306 | 4 | 4 | 4 | 4 | 4 | 4 |
| | Curing accelerator | 2MA-OK | 0.4 | 0.4 | 0.4 | 0.4 | 0.4 | 0.4 |
| | Adhesive providing agent | SP-1000 | 0.1 | 0.1 | 0.1 | 0.1 | 0.1 | 0.1 |
| | Thixotropic agent | QS-40 | 0.5 | 0.5 | 0.5 | 0.5 | 0.5 | 0.5 |
| | Spacer particle | Micropearl SP-210 | 0.1 | 0.1 | 0.1 | 0.1 | 0.1 | 0.1 |
| | Silica filler | SE-4050-SPE | 15 | 15 | 15 | 15 | 15 | 15 |
| Process conditions | Application step (1) | Area with adhesive applied thereon (%) | 50 | 50 | 50 | 50 | 50 | 50 |
| | | Corresponding drawing | FIG. 4 | FIG. 6 | FIG. 8 | FIG. 10 | FIG. 12 | FIG. 14 |
| | Semiconductor chip laminating step (2) | Area with adhesive wetting and spreading thereon (%) | 70 | 70 | 70 | 70 | 70 | 70 |
| | | Corresponding drawing | FIG. 5 | FIG. 7 | FIG. 9 | FIG. 11 | FIG. 13 | FIG. 15 |
| | Step (3) of uniformly wetting and spreading adhesive for semiconductor components | Viscosity (0.5 rpm) (Pa·s) | 7 | 7 | 7 | 7 | 7 | 7 |
| | | Treatment | Heat-retaining | Heat-retaining | Heat-retaining | Heat-retaining | Heat-retaining | Heat-retaining |
| | | Heat-retaining temperature (°C.) | 80 | 80 | 80 | 80 | 80 | 80 |
| Viscosity of adhesive | Viscosity (25°C.) (Pa·s) | (A) 0.5 rpm | 40 | 40 | 40 | 40 | 40 | 40 |
| | | (B) 1 rpm | 22 | 22 | 22 | 22 | 22 | 22 |
| | | (C) 10 rpm | 8 | 8 | 8 | 8 | 8 | 8 |
| | (B)/(C) | | 2.75 | 2.75 | 2.75 | 2.75 | 2.75 | 2.75 |
| | Viscosity (80°C.) (Pa·s) | 0.5 rpm | 7 | 7 | 7 | 7 | 7 | 7 |
| Filling properties of adhesive for semiconductor components | | | ○ | ○ | ○ | ○ | ○ | ○ |
| Extension of adhesive for semiconductor components | | | Δ | Δ | Δ | Δ | Δ | Δ |
| Variations in distance between chips (μm) | | | 6 | 8 | 7 | 8 | 6 | 8 |
| Reached level for spacers | | | 1.2 | 1.3 | 1.3 | 1.3 | 1.2 | 1.2 |
| Reflow resistance | | | ○ | ○ | ○ | ○ | ○ | ○ |
| Chip shift distance | | | ◎ | ◎ | ◎ | ◎ | ◎ | ◎ |

TABLE 3

| | | | Comparative Example 1 | Comparative Example 2 | Comparative Example 3 | Comparative Example 4 | Comparative Example 5 | Comparative Example 6 |
|---|---|---|---|---|---|---|---|---|
| Formulation of adhesive (parts by weight) | Bisphenol F type epoxy resin | EXA-830-CRP | 4 | 4 | 0 | 4 | 4 | 0 |
| | Resorcinol type epoxy resin | EX-201 | 4 | 4 | 1 | 4 | 4 | 1 |
| | Polyether type epoxy resin | Epogosey PT | 0 | 0 | 7 | 0 | 0 | 9 |
| | Epoxy group-containing acrylic resin | Blemmer CP-30 | 1 | 1 | 2 | 1 | 1 | 0 |
| | NBR-modified epoxy resin | EPR-4033 | 1 | 1 | 0 | 1 | 1 | 0 |
| | Curing agent | YH-306 | 8 | 8 | 4 | 8 | 8 | 4 |
| | Curing accelerator | 2MA-OK | 0.4 | 0.4 | 0.4 | 0.4 | 0.4 | 0.4 |
| | Adhesive providing agent | SP-1000 | 0.1 | 0.1 | 0.1 | 0.1 | 0.1 | 0.1 |
| | Thixotropic agent | QS-40 | 0.6 | 0.6 | 1.2 | 0.2 | 0.6 | 0 |
| | Spacer particle | Micropearl SP-210 | 0.1 | 0.1 | 0.1 | 0.1 | 0.1 | 0.1 |
| | Silica filler | SE-4050-SPE | 0 | 0 | 15 | 0 | 0 | 0 |
| Process conditions | Application step (1) | Area with adhesive applied thereon (%) | 20 | 95 | 50 | 50 | 50 | 50 |
| | Semiconductor chip laminating step (2) | Area with adhesive wetting and spreading thereon (%) | 40 | 110 | 70 | 70 | 70 | 70 |

TABLE 3-continued

|  |  |  | Comparative Example 1 | Comparative Example 2 | Comparative Example 3 | Comparative Example 4 | Comparative Example 5 | Comparative Example 6 |
|---|---|---|---|---|---|---|---|---|
|  | Step (3) of uniformly wetting and spreading adhesive for semiconductor components | Viscosity (0.5 rpm) (Pa·s) | 6 | 6 | 35 | 0.3 | 60 | 0.5 |
|  |  | Treatment | Heat-retaining | Heat-retaining | Heat-retaining | Heat-retaining | Ordinary temperature | Ordinary temperature |
|  |  | Heat-retaining temperature (° C.) | 80 | 80 | 80 | 80 | — | — |
| Viscosity of adhesive | Viscosity (25° C.) (Pa·s) | (A) 0.5 rpm | 60 | 60 | 150 | 5 | 60 | 0.5 |
|  |  | (B) 1 rpm | 35 | 35 | 80 | 3 | 35 | 0.3 |
|  |  | (C) 10 rpm | 7 | 7 | 20 | 2 | 7 | 0.3 |
|  | (B)/(C) |  | 5 | 5 | 4 | 1.5 | 5 | 1 |
|  | Viscosity (80° C.) (Pa·s) | 0.5 rpm | 6 | 6 | 35 | 0.3 | 6 | — |
|  | Filling properties of adhesive for semiconductor components |  | X | ○ | X | ○ | X | ○ |
|  | Extension of adhesive for semiconductor components |  | X | X | X | X | X | X |
|  | Variations in distance between chips (μm) |  | 9 | 6 | 10 | 5 | 10 | 5 |
|  | Reached level for spacers |  | 2.5 | 1.2 | 2.8 | 1.2 | 3.2 | 1.2 |
|  | Reflow resistance |  | Δ | ○ | Δ | ○ | Δ | ○ |
|  | Chip shift distance |  | ○ | ○ | ○ | Δ | ○ | Δ |

INDUSTRIAL APPLICABILITY

The present invention provides a method for producing a semiconductor chip laminate, which adjusts the amount of an adhesive for semiconductor components extending from a bonded region of a semiconductor chip and provides a smaller but highly-precise and highly-reliable semiconductor chip laminate. The present invention also provides a semiconductor device using the method for producing a semiconductor chip laminate.

EXPLANATION OF SYMBOLS

1 Substrate or another semiconductor chip
2 Semiconductor chip
3 Adhesive for semiconductor components

The invention claimed is:

1. A method for producing a semiconductor chip laminate, the semiconductor chip being bonded to a substrate or an other semiconductor chip via an adhesive for semiconductor components,
the method comprising the steps of:
(1) applying the adhesive for semiconductor components to the substrate or the other semiconductor chip;
(2) laminating the semiconductor chip on the substrate or the other semiconductor chip via the applied adhesive for semiconductor components;
(3) uniformly wetting and spreading the adhesive for semiconductor components on an entire region for bonding the semiconductor chip located on the substrate or the other semiconductor chip; and
(4) curing the adhesive for semiconductor components,
wherein, in the application step (1), an area for applying the adhesive for semiconductor components is 40% to 90% of the region for bonding the semiconductor chip located on the substrate or the other semiconductor chip,
immediately after the semiconductor chip laminating step (2), an area with the adhesive for semiconductor components wetting and spreading thereon is 60% or more and less than 100% of the region for bonding the semiconductor chip located on the substrate or the other semiconductor chip, and
in the step (3) of uniformly wetting and spreading the adhesive for semiconductor components, when measured by an E-type viscometer, a viscosity of the adhesive for semiconductor components between the substrate or the other semiconductor chip and the semiconductor chip at 0.5 rpm is 0.5 rpm is 1 Pa·s to 30 Pa·s,
wherein the adhesive for semiconductor components contains an adhesive composition containing a curing compound and a curing agent, and spacer particles having a CV value of 10% or lower, and
when measured by the E-type viscometer at 25° C., a viscosity at 0.5 rpm is 150 Pa·s or lower, a viscosity at 10 rpm is 20 Pa·s or lower, and a viscosity at 1 rpm is two to five times as high as the viscosity at 10 rpm.

2. The method for producing a semiconductor chip laminate according to claim 1,
wherein the adhesive for semiconductor components further contains a thixotropic agent.

3. The method for producing a semiconductor chip laminate according to claim 2,
wherein the thixotropic agent comprises particles having a hydrophilic group on a surface thereof.

4. The method for producing a semiconductor chip laminate according to claim 3,
wherein the adhesive for semiconductor components further contains a polymer compound having a functional group reactable with the curing compound.

5. The method for producing a semiconductor chip laminate according to claim 3,
wherein the adhesive for semiconductor components further contains a silica filler surface-treated with a phenylsilane coupling agent.

6. The method for producing a semiconductor chip laminate according to claim 2,
wherein the adhesive for semiconductor components further contains a polymer compound having a functional group reactable with the curing compound.

7. The method for producing a semiconductor chip laminate according to claim 2,
wherein the adhesive for semiconductor components further contains a silica filler surface-treated with a phenylsilane coupling agent.

8. The method for producing a semiconductor chip laminate according to claim 1,
wherein the adhesive for semiconductor components further contains a polymer compound having a functional group reactable with the curing compound.

9. The method for producing a semiconductor chip laminate according to claim 8, wherein the adhesive for semiconductor components further contains a silica filler surface-treated with a phenylsilane coupling agent.

10. The method for producing a semiconductor chip laminate according to claim 1, wherein the adhesive for semiconductor components further contains a silica filler surface-treated with a phenylsilane coupling agent.

11. The method for producing a semiconductor chip laminate according to claim 1,
wherein, in the semiconductor chip laminating step (2), the semiconductor chip laminated to the substrate or the other semiconductor chip is pressed at a pressure of 0.01 to 1.0 MPa for 0.1 to 5 seconds.

12. A method for producing a semiconductor chip laminate, the semiconductor chip being bonded to a substrate or an other semiconductor chip via an adhesive for semiconductor components,
the method comprising the steps of:
(1) applying the adhesive for semiconductor components to the substrate or the other semiconductor chip;
(2) laminating the semiconductor chip on the substrate or the other semiconductor chip via the applied adhesive for semiconductor components;
(3) uniformly wetting and spreading the adhesive for semiconductor components on an entire region for bonding the semiconductor chip located on the substrate or the other semiconductor chip; and
(4) curing the adhesive for semiconductor components,
wherein, in the application step (1), an area for applying the adhesive for semiconductor components is 40% to 90% of the region for bonding the semiconductor chip located on the substrate or the other semiconductor chip,
immediately after the semiconductor chip laminating step (2), an area with the adhesive for semiconductor components wetting and spreading thereon is 60% or more and less than 100% of the region for bonding the semiconductor chip located on the substrate or the other semiconductor chip, and
in the step (3) of uniformly wetting and spreading the adhesive for semiconductor components, when measured by an E-type viscometer, a viscosity of the adhesive for semiconductor components between the substrate or the other semiconductor chip and the semiconductor chip at 0.5 rpm is 1 Pa·s to 30 Pa·s;
wherein the step (3) of uniformly wetting and spreading the adhesive for semiconductor components comprises: a step (3-1) of heating the adhesive for semiconductor components between the substrate or the other semiconductor chip and the semiconductor chip; and a step (3-2) of heat-retaining the heated adhesive for semiconductor components,
wherein the adhesive for semiconductor components contains an adhesive composition containing a curing compound and a curing agent, and spacer particles having a CV value of 10% or lower, and
when measured by the E-type viscometer at 25° C., a viscosity at 0.5 rpm is 150 Pa·s or lower, a viscosity at 10 rpm is 20 Pa·s or lower, and a viscosity at 1 rpm is two to five times as high as the viscosity at 10 rpm.

13. The method for producing a semiconductor chip laminate according to claim 12, wherein, in the step (3) of uniformly wetting and spreading the adhesive for semiconductor components, a fillet partially extends from two or more sites of the region for bonding the semiconductor chip located on the substrate or the other semiconductor chip.

14. The method for producing a semiconductor chip laminate according to claim 12,
wherein, in the semiconductor chip laminating step (2), the semiconductor chip laminated to the substrate or the other semiconductor chip is pressed at a pressure of 0.01 to 1.0 MPa for 0.1 to 5 seconds.

15. The method for producing a semiconductor chip laminate, the semiconductor chip being bonded to a substrate or an other semiconductor chip via an adhesive for semiconductor components,
the method comprising the steps of:
(1) applying the adhesive for semiconductor components to the substrate or the other semiconductor chip;
(2) laminating the semiconductor chip on the substrate or the other semiconductor chip via the applied adhesive for semiconductor components;
(3) uniformly wetting and spreading the adhesive for semiconductor components on an entire region for bonding the semiconductor chip located on the substrate or the other semiconductor chip; and
(4) curing the adhesive for semiconductor components,
wherein, in the application step (1), an area for applying the adhesive for semiconductor components is 40% to 90% of the region for bonding the semiconductor chip located on the substrate or the other semiconductor chip,
immediately after the semiconductor chip laminating step (2), an area with the adhesive for semiconductor components wetting and spreading thereon is 60% or more and less than 100% of the region for bonding the semiconductor chip located on the substrate or the other semiconductor chip,
in the step (3) of uniformly wetting and spreading the adhesive for semiconductor components, when measured by an E-type viscometer, a viscosity of the adhesive for semiconductor components between the substrate or the other semiconductor chip and the semiconductor chip at 0.5 rpm is 1 Pa·s to 30 Pa·s,
wherein the step (3) of uniformly wetting and spreading the adhesive for semiconductor components, a fillet partially extends from two or more sites of the region for bonding the semiconductor chip located on the substrate or the other semiconductor chip,
wherein the adhesive for semiconductor components contains an adhesive composition containing a curing compound and a curing agent, and spacer particles having a CV value of 10% or lower, and
when measured by the E-type viscometer at 25° C., a viscosity at 0.5 rpm is 150 Pa·s or lower, a viscosity at 10 rpm is 20 Pa·s or lower, and a viscosity at 1 rpm is two to five times as high as the viscosity at 10 rpm.

16. The method for producing a semiconductor chip laminate according to claim 15,
wherein, in the semiconductor chip laminating step (2), the semiconductor chip laminated to the substrate or the other semiconductor chip is pressed at a pressure of 0.01 to 1.0 MPa for 0.1 to 5 seconds.

* * * * *